United States Patent
Nakatake et al.

(10) Patent No.: US 8,427,225 B2
(45) Date of Patent: Apr. 23, 2013

(54) GATE DRIVING CIRCUIT

(75) Inventors: Hiroshi Nakatake, Tokyo (JP); Masaru Fuku, Tokyo (JP); Tatsuya Okuda, Tokyo (JP); Yoshikazu Tsunoda, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 349 days.

(21) Appl. No.: 12/681,515

(22) PCT Filed: Sep. 3, 2008

(86) PCT No.: PCT/JP2008/065852
§ 371 (c)(1),
(2), (4) Date: Apr. 2, 2010

(87) PCT Pub. No.: WO2009/044602
PCT Pub. Date: Apr. 9, 2009

(65) Prior Publication Data
US 2010/0213989 A1 Aug. 26, 2010

(30) Foreign Application Priority Data
Oct. 2, 2007 (JP) ................................. 2007-258568

(51) Int. Cl.
*H03K 17/687* (2006.01)

(52) U.S. Cl.
USPC ............ 327/427; 327/108; 327/112; 327/434

(58) Field of Classification Search .......... 327/108–112, 327/170, 374–377, 379, 284; 326/21–24, 326/82–84, 89
See application file for complete search history.

(56) References Cited

U.S. PATENT DOCUMENTS

| | | | |
|---|---|---|---|
| 6,222,403 B1 | 4/2001 | Mitsuda | |
| 6,788,128 B2 | 9/2004 | Tsuchida | |
| 7,859,315 B2 * | 12/2010 | Nakamori et al. | 327/109 |
| 2008/0094111 A1 * | 4/2008 | Nakamori et al. | 327/108 |

FOREIGN PATENT DOCUMENTS

| | | |
|---|---|---|
| JP | 8 242580 | 9/1996 |
| JP | 11 346147 | 12/1999 |
| JP | 2003 318713 | 11/2003 |
| JP | 2005 311555 | 11/2005 |
| JP | 2007 116760 | 5/2007 |

OTHER PUBLICATIONS

U.S. Appl. No. 13/260,069, filed Sep. 23, 2011, Nakatake, et al.
Office Action mailed Dec. 6, 2011, in Japanese Patent Application No. 2009-536000 (with English-language Translation).

* cited by examiner

*Primary Examiner* — Lincoln Donovan
*Assistant Examiner* — Brandon S Cole
(74) *Attorney, Agent, or Firm* — Oblon, Spivak, McClelland, Maier & Neustadt, L.L.P.

(57) ABSTRACT

To obtain a gate driving circuit in which rising of a constant current of a constant current circuit is fast and power saving is achieved, the gate driving circuit includes: a constant current driving circuit (28) for supplying a constant current; a gate terminal of a power semiconductor element (1), which is connected to an output terminal of the constant current driving circuit; a comparator (22) for comparing a voltage at the gate terminal with a predetermined voltage value and outputting a signal indicating that the voltage is higher than the predetermined voltage value; and a driving control section (20) for increasing a current from the constant current driving circuit in response to a signal for turning on the power semiconductor element, and reducing the current from the constant current driving circuit in response to the signal from the comparator.

13 Claims, 16 Drawing Sheets

GATE DRIVING CIRCUIT

TECHNICAL FIELD

The present invention relates to a gate driving circuit for driving a power semiconductor element.

BACKGROUND ART

In a conventional gate driving circuit for a power semiconductor element of a load driving device, in order to drive an insulated gate transistor, a constant current circuit and a current mirror circuit are used to supply a constant current to a gate terminal. In order to switch a current value of the constant current circuit, a switch provided in series with the constant current circuit is used (see, for example, Patent Document 1).

Patent Document 1: JP 2003-318713 A (FIG. 1)

DISCLOSURE OF THE INVENTION

Problem to be Solved by the Invention

In the conventional gate driving circuit, when the insulated gate transistor is to be turned on, the current of the gate terminal does not rapidly become a constant value because of a limited rising speed of the constant current circuit. Further, the switch provided in series together with the constant current circuit is used to switch the current value of the constant current circuit, and hence the constant current circuit requires an increase in current to a predetermined current value from a non-operating state. Therefore, there is a case where the rising of the constant current is delayed. If a threshold voltage (VGEth) of the gate terminal varies, a turn-on loss varies, and hence a thermal design having a large margin is required. Thus, there is a problem in that an efficient thermal design cannot be achieved.

The present invention has been made to solve the problem as described above. It is an object of the present invention to obtain a gate driving circuit in which the rising of the constant current of the constant current circuit is fast and power saving is achieved. Further, it is an object of the present invention to obtain a gate driving circuit in which a variation in turn-on loss may be suppressed to realize an efficient thermal design even if the threshold voltage varies in a case where a power semiconductor element is turned on.

Means for Solving the Problem

A gate driving circuit according to the present invention includes: a constant current driving circuit for supplying a constant current; a gate terminal of a power semiconductor element, which is connected to an output terminal of the constant current driving circuit; a comparator for comparing a voltage at the gate terminal with a predetermined voltage value and outputting a signal indicating that the voltage is higher than the predetermined voltage value; and a driving control section for increasing a current from the constant current driving circuit in response to a signal for turning on the power semiconductor element, and reducing the current from the constant current driving circuit in response to the signal from the comparator.

Further, there is provided a gate driving circuit including: a constant current driving circuit for supplying a constant current; a gate terminal of a power semiconductor element, which is connected to an output terminal of the constant current driving circuit; an auxiliary current supply circuit which is connected to the output terminal of the constant current driving circuit in parallel with the gate terminal or connected to the gate terminal; a first switch which is provided in the constant current driving circuit or between the output terminal and the gate terminal; a second switch for turning on and off the auxiliary current supply circuit; and a driving control section for turning on and off the first switch and the second switch to supply a current output from the constant current driving circuit to the auxiliary current supply circuit, and turning the current supplied to the auxiliary current supply circuit to flow into the gate terminal after the current is held to a predetermined current value.

Effects of the Invention

According to the gate driving circuit of the present invention, the constant current of the constant current driving circuit is varied, and hence the rising is fast. Therefore, even if a threshold voltage varies, a variation in turn-on loss is suppressed, and hence a thermal design having a large margin is not required and an efficient thermal design may be performed. Consequently, raw materials may be reduced in weight. Besides, the current is increased only if necessary, and hence power saving is achieved.

When a power semiconductor element is to be turned on, the current is supplied to the auxiliary current supply circuit and turned to flow into the gate terminal after the current reaches the constant current value, and hence constant-current driving may be performed during a turn-on period. Therefore, even if the threshold voltage varies, a variation in turn-on loss is suppressed, and hence a thermal design having a large margin is not required and an efficient thermal design may be performed. Consequently, raw materials may be reduced in weight.

BEST MODE FOR CARRYING OUT THE INVENTION

Embodiment 1

Figure 1:
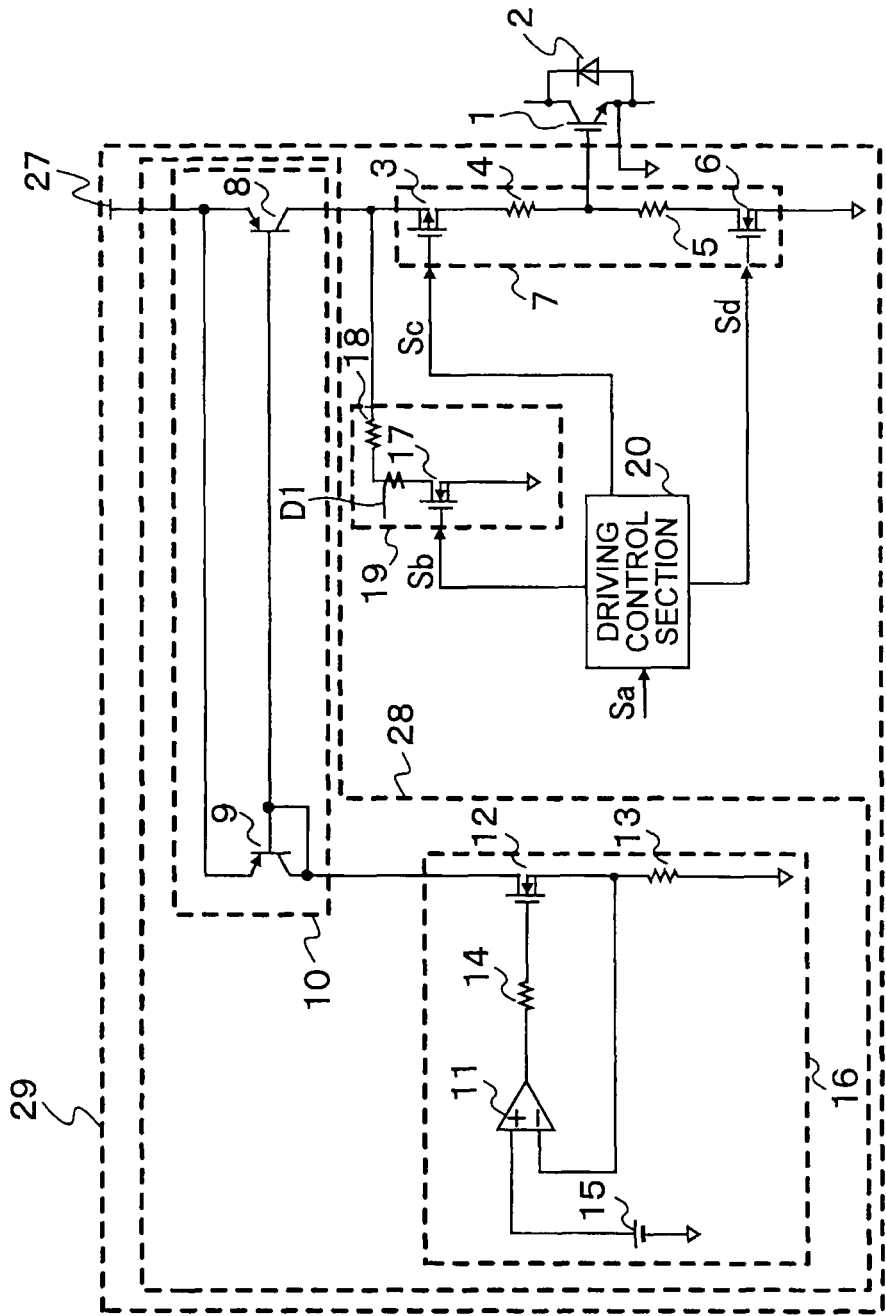
FIG. 1 is a circuit diagram illustrating a gate driving circuit according to Embodiment 1 of the present invention.

FIG. 1 is a circuit diagram illustrating a gate driving circuit according to Embodiment 1 of the present invention. An insulated gate bipolar transistor (IGBT) 1 is used as a power semiconductor element 1. However, the present invention is not limited to the IGBT. Even when a switch such as a field effect transistor (FET) or a switch made of not only silicon but also a material such as silicon carbide (SiC) or gallium nitride (GaN) is used as the power semiconductor element, the same effect is obtained. A combination of the IGBT 1, a diode 2, and a gate driving circuit 29 may be used for various power converters including, for example, a three-phase inverter circuit illustrated in FIG. 2.

Figure 2:
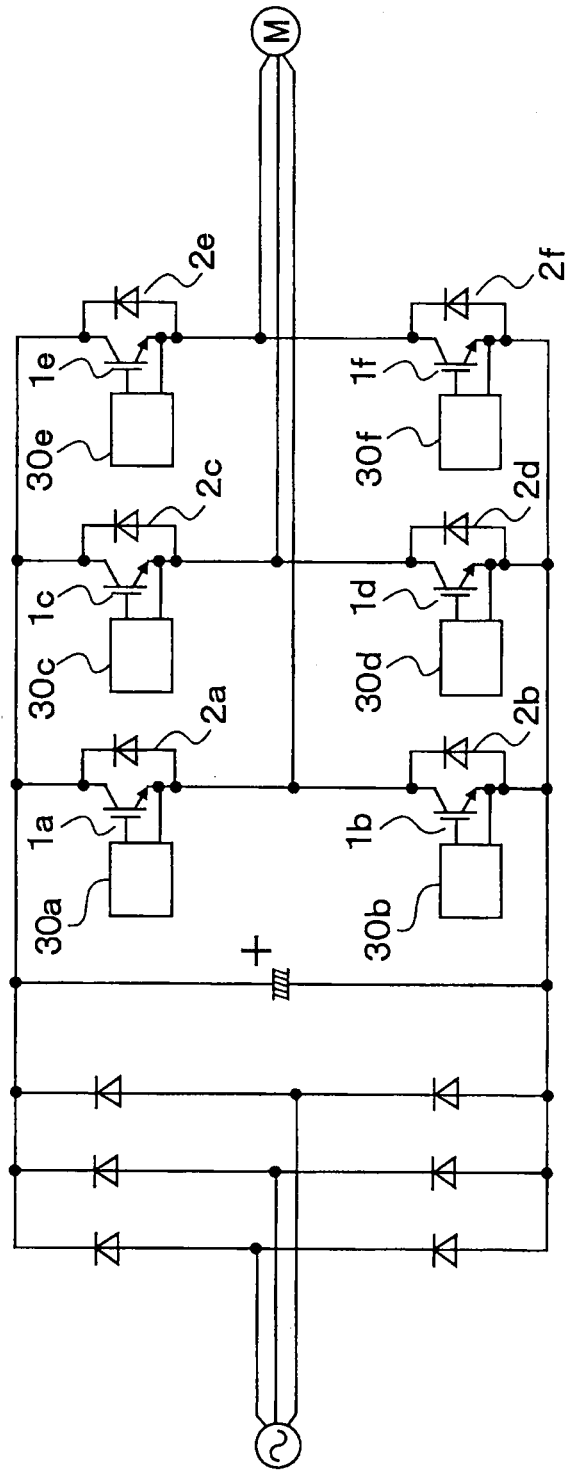
FIG. 2 is a circuit diagram illustrating an example of a power converter to which the present invention is applied.

In FIG. 2, reference symbols 1a to 1f denote power semiconductor elements (IGBTs), 2a to 2f denote diodes, and 30a to 30f denote gate driving circuits. Currents obtained from an alternating-current power source through a rectifier and a smoothing capacitor are adjusted by the switching control of the power semiconductor elements 1a to 1f by the gate driving circuits 30a to 30f, to thereby perform the driving control of a motor M which is an example of a load.

The gate driving circuit 29 for the IGBT 1 includes a constant current driving circuit 28 connected to a positive power source 27, an auxiliary current supply circuit 19 and a switching circuit 7 which are connected in parallel from an output terminal of the constant current driving circuit 28, and a driving control section (driving control means) 20 including a microcomputer or a logic circuit and a timer, for controlling the turning-ON/OFF of switches provided in the respective circuits.

The switching circuit 7 is connected to a gate terminal of the IGBT 1 to switch between gate charging and discharging. The switching circuit 7 includes a P-channel MOSFET 3 serving as a first switch turned on to adjust a current flowing into the gate when the IGBT 1 is to be turned on, an N-channel MOSFET 6 turned on when the IGBT 1 is to be turned off, a gate resistor 4 which is connected between the P-channel MOSFET 3 and the gate of the IGBT 1 and used at the time of turning-on, and a gate resistor 5 which is connected between the N-channel MOSFET 6 and the gate of the IGBT 1 and used at the time of turning-off.

A source, drain, and gate of the P-channel MOSFET 3 are connected to the output terminal of the constant current driving circuit 28, one end of the gate resistor 4, and the driving control section 20, respectively. The other end of the gate resistor 4 and one end of the gate resistor 5 are connected to the gate terminal of the IGBT 1. A drain, source, and gate of the N-channel MOSFET 6 are connected to the other end of the gate resistor 5, a ground side, and the driving control section 20, respectively.

The auxiliary current supply circuit 19 includes an N-channel MOSFET 17 serving as a second switch for adjusting the current flowing into the gate and a resistor 18 connected in series to the N-channel MOSFET 17. One end of the resistor 18 is connected to the output terminal of the constant current driving circuit 28 and the other end is connected to a drain of the N-channel MOSFET 17. A source and gate of the N-channel MOSFET 17 are connected to the ground side and the driving control section 20, respectively.

The driving control section 20 receives a control command signal Sa for the IGBT 1 from an external control section (not shown) and outputs a control command signal Sb for the auxiliary current supply circuit 19 and control command signals Sc and Sd for the switching circuit 7.

The constant current driving circuit 28 includes a current mirror circuit 10 and a constant current circuit 16 for driving the current mirror circuit 10. The current mirror circuit 10 includes PNP transistors 8 and 9. Emitters of the PNP transistors 8 and 9 are connected together to the positive power source 27. Bases of the PNP transistors 8 and 9 are connected to each other. The base and collector of the PNP transistor 9 are connected to each other. A collector of the PNP transistor 8 serves as the output terminal of the constant current driving circuit 28. The collector and base of the PNP transistor 9 are connected to the constant current circuit 16. The single PNP transistor 8 is illustrated in FIG. 1. However, when a large gate current is to be supplied, a large number of PNP transistors are connected in parallel.

The constant current circuit 16 connected to the collector of the PNP transistor 9 includes an operational amplifier 11, an N-channel MOSFET 12, a set resistor 13, a gate resistor 14, and a reference power source 15. A drain of the N-channel MOSFET 12 is connected to the collector of the PNP transistor 9 of the current mirror circuit 10. A source of the N-channel MOSFET 12 is connected to one of input terminals of the operational amplifier 11 and the ground side through the set resistor 13. A gate of the N-channel MOSFET 12 is connected to an output of the operational amplifier 11 through the gate resistor 14. The other input terminal of the operational amplifier 11 is connected to the reference power source 15.

Note that the constant current driving circuit 28 is not limited to the circuit described above, and thus another constant current circuit may be used.

Figure 3:
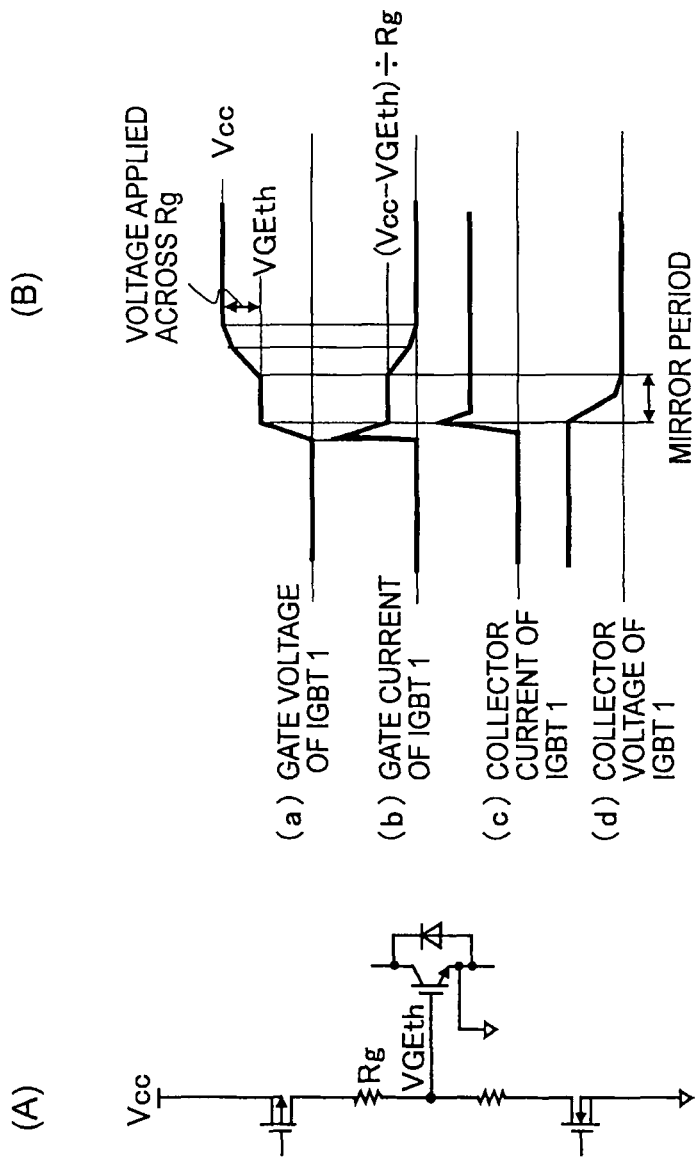
FIG. 3 is an explanatory timing chart illustrating an operation in Embodiment 1 of the present invention.

Next, an operation of the circuit is described with reference to timing charts of FIGS. 3 to 5. In FIG. 3, (A) is a circuit diagram illustrating a circuit including the switching circuit 7 of the gate driving circuit 29, the IGBT 1, and the diode 2. In FIG. 3, (B) is an explanatory timing chart illustrating an operation in a case where the IGBT 1 included in the circuit of (A) of FIG. 3 is driven with a constant voltage. In (B) of FIG. 3, (a) and (b) exhibit a gate voltage and gate current of the IGBT 1, respectively, and (c) and (d) exhibit a collector current and collector voltage of the IGBT 1, respectively.

In the case where the IGBT 1 included in the circuit of (A) of FIG. 3 is driven with the constant voltage, when a period in which the gate voltage is constant ((a) in (B) of FIG. 3) and a mirror effect of delayed switching occurs is assumed as a mirror period, the gate current determined by "(Vcc−VGEth)/Rg" ((b) in (B) of FIG. 3) flows during the mirror period. Note that Vcc indicates a constant voltage, VGEth indicates a gate threshold voltage of the IGBT 1, and Rg indicates a resistance value of the gate resistor 4. The mirror period continues until the charging of a gate-collector capacitor is completed by the gate current. The collector voltage changes during the mirror period ((d) in (B) of FIG. 3). Therefore, when the mirror period may be maintained constant, a variation in turn-on loss ((collector voltage)×(collector current)) during the change in collector voltage may be eliminated. When the mirror period is to be maintained constant, it is only necessary to set a gate-collector capacitance to a constant value and maintain the gate current constant. However, in general, a variation in VGEth is larger than a variation in gate-collector capacitance, and hence the gate current cannot be maintained constant by the constant voltage driving. Thus, in order to reduce the variation in turn-on loss, the constant current driving for maintaining the gate current constant is required.

Figure 4:
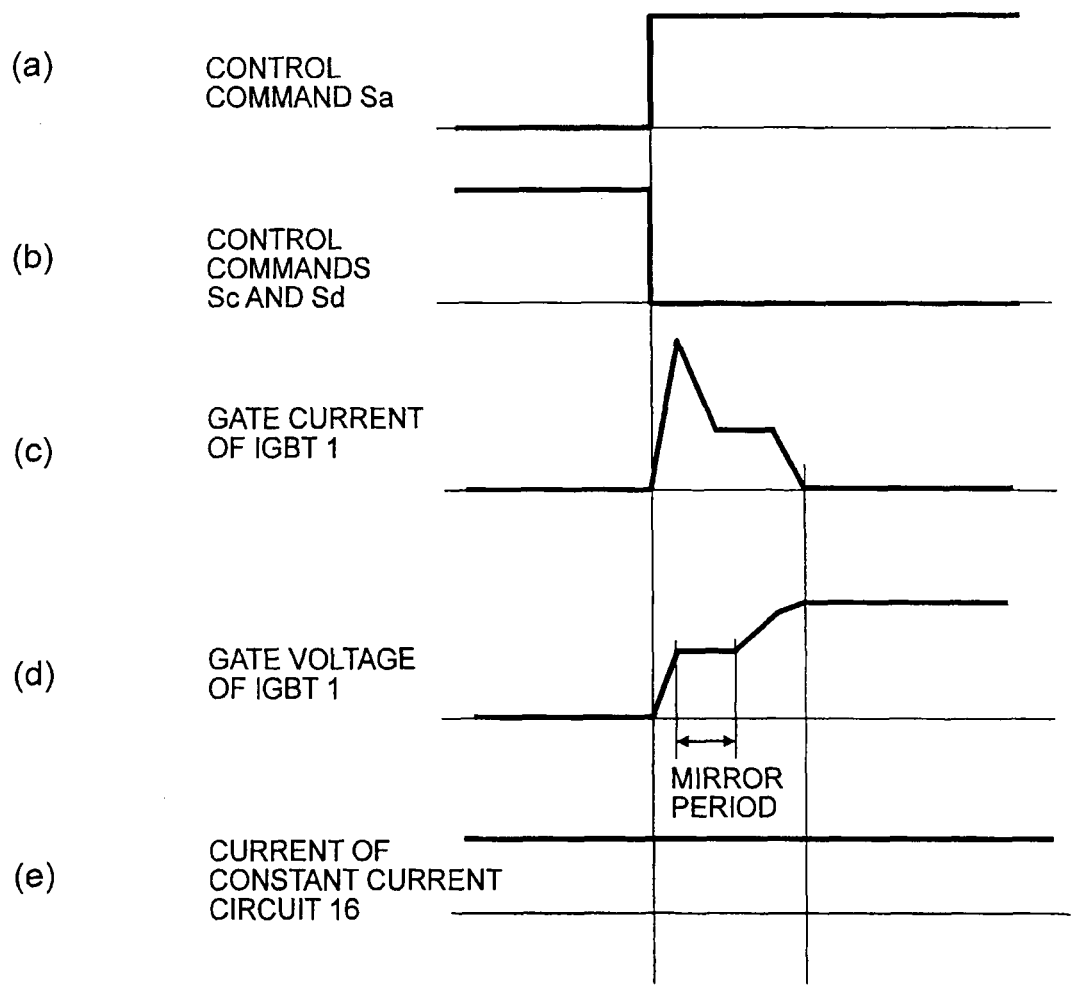
FIG. 4 is an explanatory timing chart illustrating the operation in Embodiment 1 of the present invention.

FIG. 4 is an explanatory timing chart illustrating an operation of the circuit illustrated in FIG. 1 in a case where a constant current power source is used and the auxiliary current supply circuit 19 is not provided. In FIG. 4, (a) exhibits a control command signal Sa, (b) exhibits control command signals Sc and Sd, (c) and (d) exhibit a gate current and gate voltage of the IGBT 1, respectively, and (e) exhibits a current of the constant current circuit 16. The control command signal Sa from the external control section is a signal for turning on the IGBT 1 when the signal is "H" and turning off the IGBT 1 when the signal is "L". For example, as in the case of the IGBTs 1a and 1b illustrated in FIG. 2, the IGBT 1 is connected in series to another IGBT to provide a set of IGBTs. When the control command signal Sa is "L", the other of the set of the IGBTs is turned on (hereinafter the same shall apply).

The driving control section 20 outputs the control command signals Sc and Sd of "L (Low)" ((b) of FIG. 4) to the P-channel MOSFET 3 and the N-channel MOSFET 6 of the switching circuit 7, respectively, at the same timing as the control command signal Sa of "H(High)" for turning on the IGBT 1 from the external control section. The current of the constant current circuit 16 continuously flows ((e) of FIG. 4). When the control command signals Sc and Sd become "L", the P-channel MOSFET 3 is turned on and the N-channel MOSFET 6 is turned off, and hence the gate current of the IGBT 1 starts to flow ((c) of FIG. 4). In this case, the gate current does not immediately become a constant current value which is set in advance.

An emitter-collector voltage of the PNP transistor 8 of the current mirror circuit 10 rapidly changes, and hence a displacement current flows into the gate of the IGBT 1 through an emitter-collector parasitic capacitor. When the displacement current is large, the mirror period of the IGBT 1 starts before an output current of the current mirror circuit 10 becomes the constant current value which is set in advance. The mirror period of the IGBT 1 is determined based on not the constant current value but the gate threshold voltage VGEth of the IGBT 1. For example, when VGEth is large, a current becoming the constant current is small, and hence the mirror period continuing until a predetermined amount of gate charges are stored becomes longer and the turn-on loss increases. Therefore, when the gate threshold voltage VGEth varies, the mirror period and the turn-on loss vary.

Figure 5:
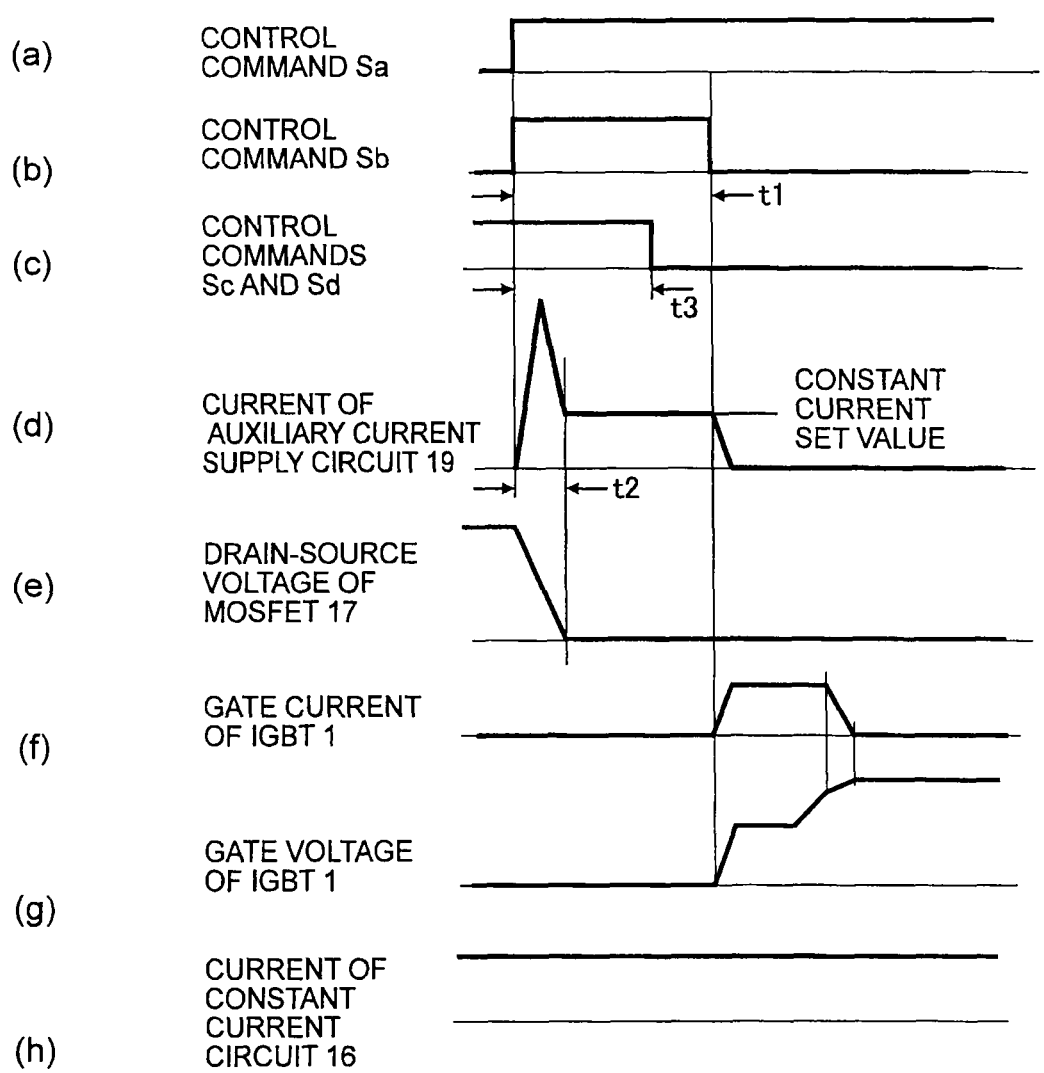
FIG. 5 is an explanatory timing chart illustrating the operation in Embodiment 1 of the present invention.

FIG. 5 is an explanatory timing chart illustrating an operation of the circuit illustrated in FIG. 1 in a case where the constant current power source is used and the auxiliary current supply circuit 19 is provided. In FIG. 5, (a) exhibits the control command signal Sa, (b) exhibits the control command signal Sb, (c) exhibits the control command signals Sc and Sd, (d) exhibits a current of the auxiliary current supply circuit 19, (e) exhibits a drain-source voltage of the MOSFET 17, (f) and (g) exhibit a gate current and gate voltage of the IGBT 1, respectively, and (h) exhibits a current of the constant current circuit 16. When the control command signal Sa from the external control section becomes "H" ((a) of FIG. 5), the driving control section 20 sets the control command signal Sb to "H" for a predetermined period t1 ((b) of FIG. 5). Then, the MOSFET 17 serving as the second switch is turned on, and hence the current flows into the auxiliary current supply circuit 19. At this time, as in the case where the auxiliary current supply circuit 19 is not provided, a large displacement current is generated from the constant current circuit 16 and flows into the auxiliary current supply circuit 19 ((d) of FIG. 5).

A period t2 in which the current flowing into the auxiliary current supply circuit 19 becomes the constant current (constant current set value) ((d) of FIG. 5) is measured in advance and a period t3 including the period t2 and a margin ((c) of FIG. 5) is set. The driving control section 20 performs timing control to set the control command signals Sc and Sd to "L" after the lapse of the period t3, to thereby turn on the P-channel MOSFET 3 serving as the first switch and simultaneously turn off the N-channel MOSFET 6 ((c) of FIG. 5). An operation may be performed such that, when the current value of the auxiliary current supply circuit 19 is detected by a current sensor (D1 of FIG. 1) and the driving control section 20 determines, based on the detected value, that the current value of the auxiliary current supply circuit 19 reaches the constant current value which is set in advance, the control command signals Sc and Sd are set to "L" to turn on the first switch 3. After that, the driving control section 20 sets the control command signal Sb to "L" to turn off the second switch 17, to thereby turn off the auxiliary current supply circuit 19. When the auxiliary current supply circuit 19 is turned off, the current flowing through the auxiliary current supply circuit 19 now flows into the gate terminal of the IGBT 1, and hence the gate terminal may be charged with the constant current ((f) of FIG. 5).

In the gate driving circuit 29 having the structure as described above, when the IGBT 1 is to be turned on, the current from the current mirror circuit 10 is supplied to the auxiliary current supply circuit 19. After the current reaches the constant current value, the current turns to flow into the gate terminal of the IGBT 1, and hence the IGBT 1 may be driven with the constant current during the turn-on period. Therefore, even when the threshold voltage varies, the variation in mirror period continuing until the gate-collector capacitor is charged may be suppressed. A variation in period in which the collector voltage changes, of the mirror period may be suppressed, and hence the variation in turn-on loss expressed by "(collector voltage)×(collector current)" may be also suppressed. The turn-on loss is changed to heat, but because the variation is suppressed, a thermal design having a large margin is not required in designing a power converter, and hence an efficient thermal design may be performed. A low-cost power converter may be manufactured owing to the efficient thermal design.

Embodiment 2

Figure 6:
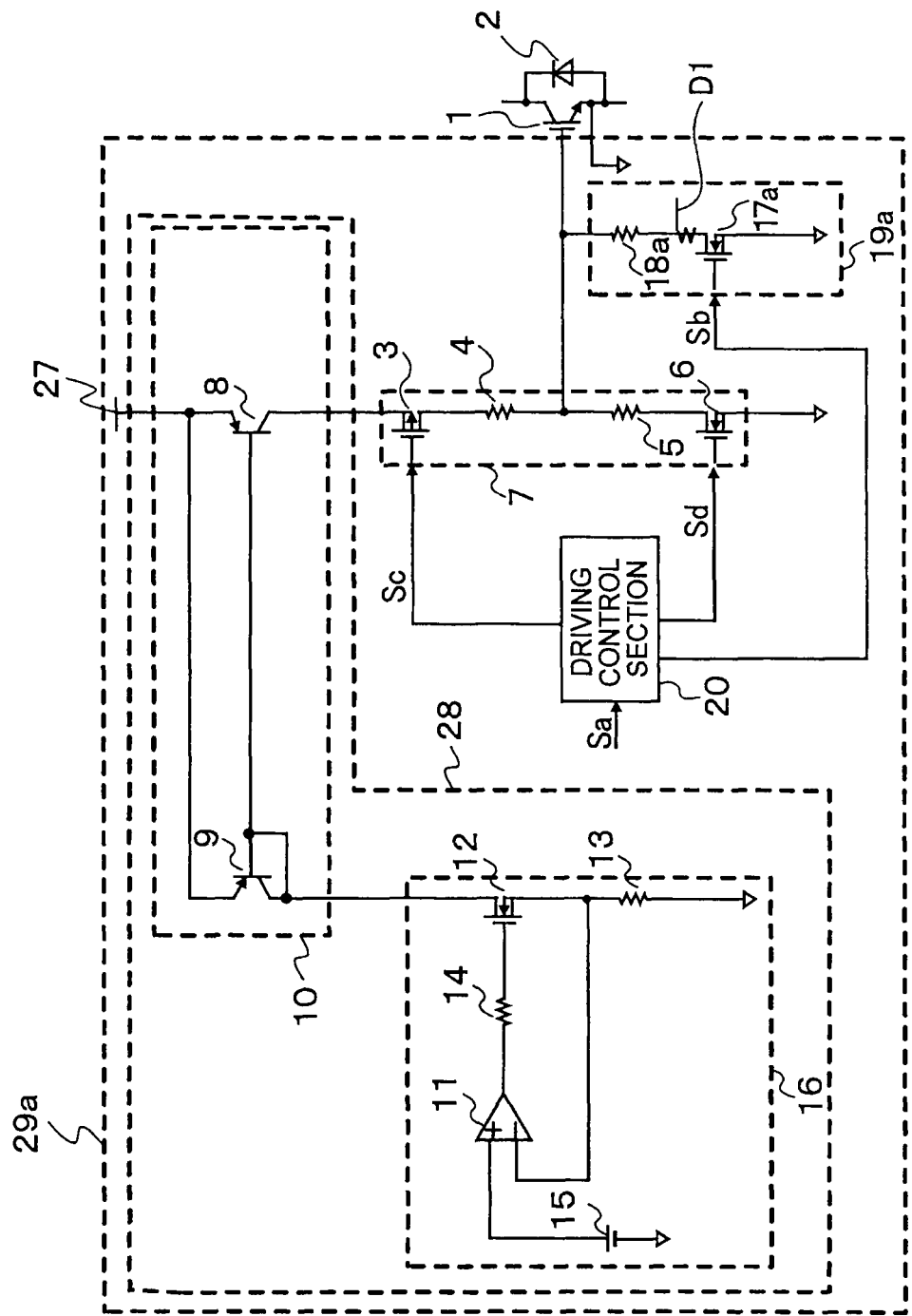
FIG. 6 is a circuit diagram illustrating a gate driving circuit according to Embodiment 2 of the present invention.

FIG. 6 is a circuit diagram illustrating a gate driving circuit according to Embodiment 2 of the present invention. In FIG. 6, the same or corresponding portions as in the embodiment described above are denoted by the same or related reference symbols and thus the description thereof is omitted. In a gate driving circuit 29a illustrated in FIG. 6, an auxiliary current supply circuit 19a which includes an N-channel MOSFET 17a serving as the second switch for adjusting the current flowing into the gate terminal of the IGBT 1 and a resistor 18a is connected to the gate terminal of the IGBT 1. A drain of the N-channel MOSFET 17a is connected to the gate terminal of the IGBT 1 through the resistor 18a. A gate of the N-channel MOSFET 17a is connected to the driving control section 20. A source of the N-channel MOSFET 17a is connected to the ground side.

Figure 7:
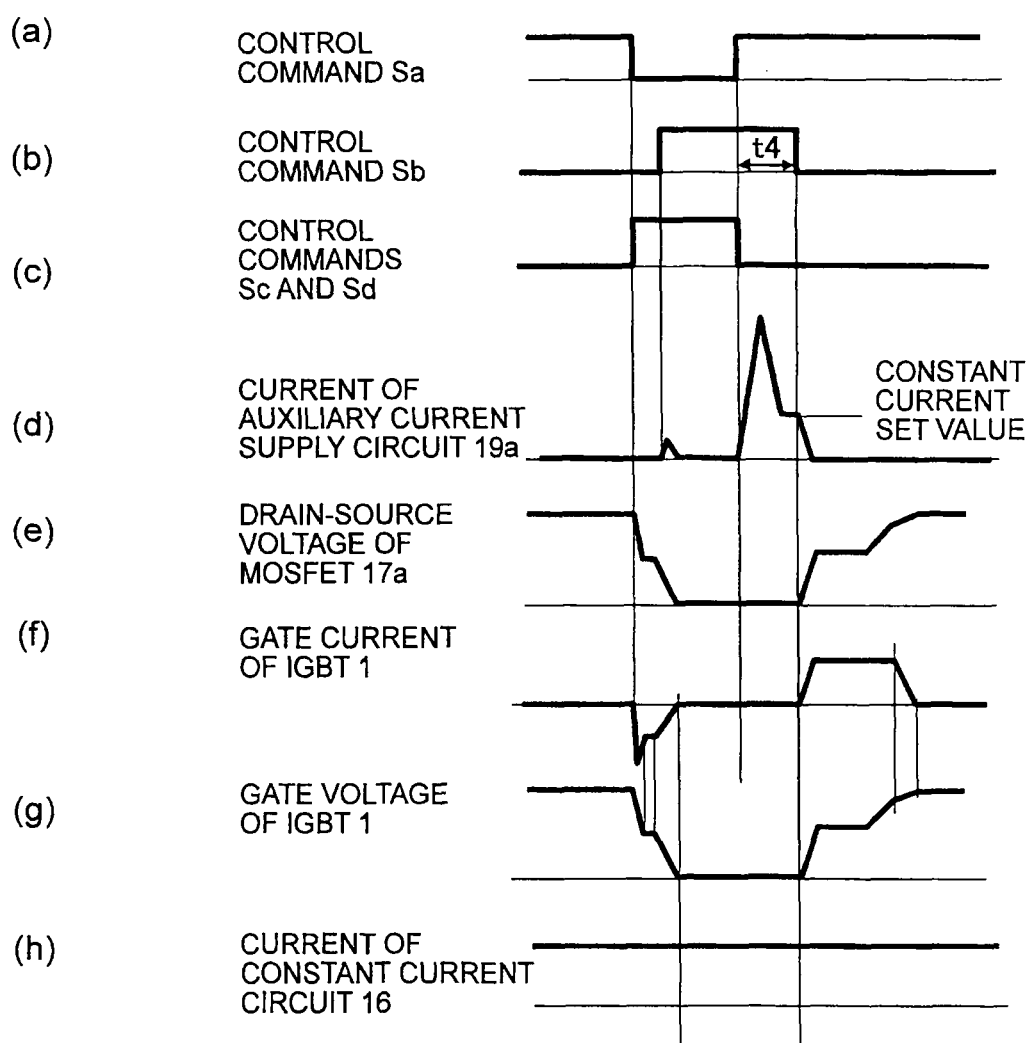
FIG. 7 is an explanatory timing chart illustrating an operation in Embodiment 2 of the present invention.

FIG. 7 is an explanatory timing chart illustrating an operation of the circuit illustrated in FIG. 6. In FIG. 7, (a) exhibits the control command signal Sa, (b) exhibits the control command signal Sb, (c) exhibits the control command signals Sc and Sd, (d) exhibits a current of the auxiliary current supply circuit 19a, (e) exhibits a drain-source voltage of the MOSFET 17a, (f) and (g) exhibit a gate current and gate voltage of the IGBT 1, respectively, and (h) exhibits a current of the constant current circuit 16.

Hereinafter, the operation is described with reference to FIGS. 6 and 7. The driving control section 20 simultaneously outputs the control command signals Sc and Sd of "H" ((c) of FIG. 7) to the first switch 3 including the N-channel MOSFET and the N-channel MOSFET 6 in synchronization with the control command signal Sa of "L" for turning on the other of the set of IGBTs ((a) of FIG. 7), to thereby turn off the first switch 3 and simultaneously turn on the N-channel MOSFET 6. After that, the control command signal Sb of "H" is output to the second switch 17a to turn on the second switch 17a, to thereby turn on the auxiliary current supply circuit 19a ((b) of FIG. 7).

After that, when the control command signal Sa becomes "H", the driving control section 20 switches the control command signals Sc and Sd to "L", and hence the first switch 3 is turned on while the N-channel MOSFET 6 is turned off. The auxiliary current supply circuit 19a is turned on in advance, and hence a large current including the displacement current of the current mirror circuit 10 flows through the auxiliary current supply circuit 19a ((d) of FIG. 7). A value of the resistor 18a of the auxiliary current supply circuit 19a is set to such a small value that prevents the IGBT 1 from being turned on by the gate voltage increased by the current flowing through the auxiliary current supply circuit 19a. After the current of the auxiliary current supply circuit 19a becomes the constant current (constant current set value), the control command signal Sb is switched to "L" to turn off the second switch 17a, to thereby turn off the auxiliary current supply circuit 19a. Then, the current flowing through the auxiliary current supply circuit 19 now flows into the gate terminal of the IGBT 1, and hence the gate of the IGBT 1 is charged with the constant current ((f) of FIG. 7).

With regard to a period t4 between the time when the first switch 3 is turned on and the time when the second switch 17a is turned off, a period between the time when the first switch 3 is turned on and the time when the current of the auxiliary current supply circuit 19a becomes constant is measured in advance and the period t4 ((b) of FIG. 7) is set to include the measured period and a margin. An operation may be performed such that, when the current value of the auxiliary current supply circuit 19a is detected by the current sensor D1 and the driving control section 20 determines, based on the detected current value, that the current value of the auxiliary current supply circuit 19a reaches the constant current value which is set in advance, the control command signal Sb is set to "L" to turn off the auxiliary current supply circuit 19a.

In the gate driving circuit 29a having the structure as described above, even when the threshold voltage varies, the variation in turn-on loss may be suppressed, and hence an efficient thermal design may be performed. The gate and emitter of the IGBT 1 are short-circuited with a low impedance, and hence a high-speed operation may be realized. The gate is short-circuited with a low impedance, and hence the gate voltage is not increased by noise and the IGBT 1 may be prevented from being erroneously turned on. This reason is as follows. In a case of an inverter, even when the IGBT 1 is turned off, high dv/dt is applied between the collector and the emitter by recovery by the diode 2 connected in parallel to the IGBT 1 and then applied to the gate to increase the gate voltage, to thereby erroneously turn on the IGBT 1. However, when the gate is short-circuited with the low impedance, such an erroneous operation may be prevented.

Embodiment 3

Figure 8:
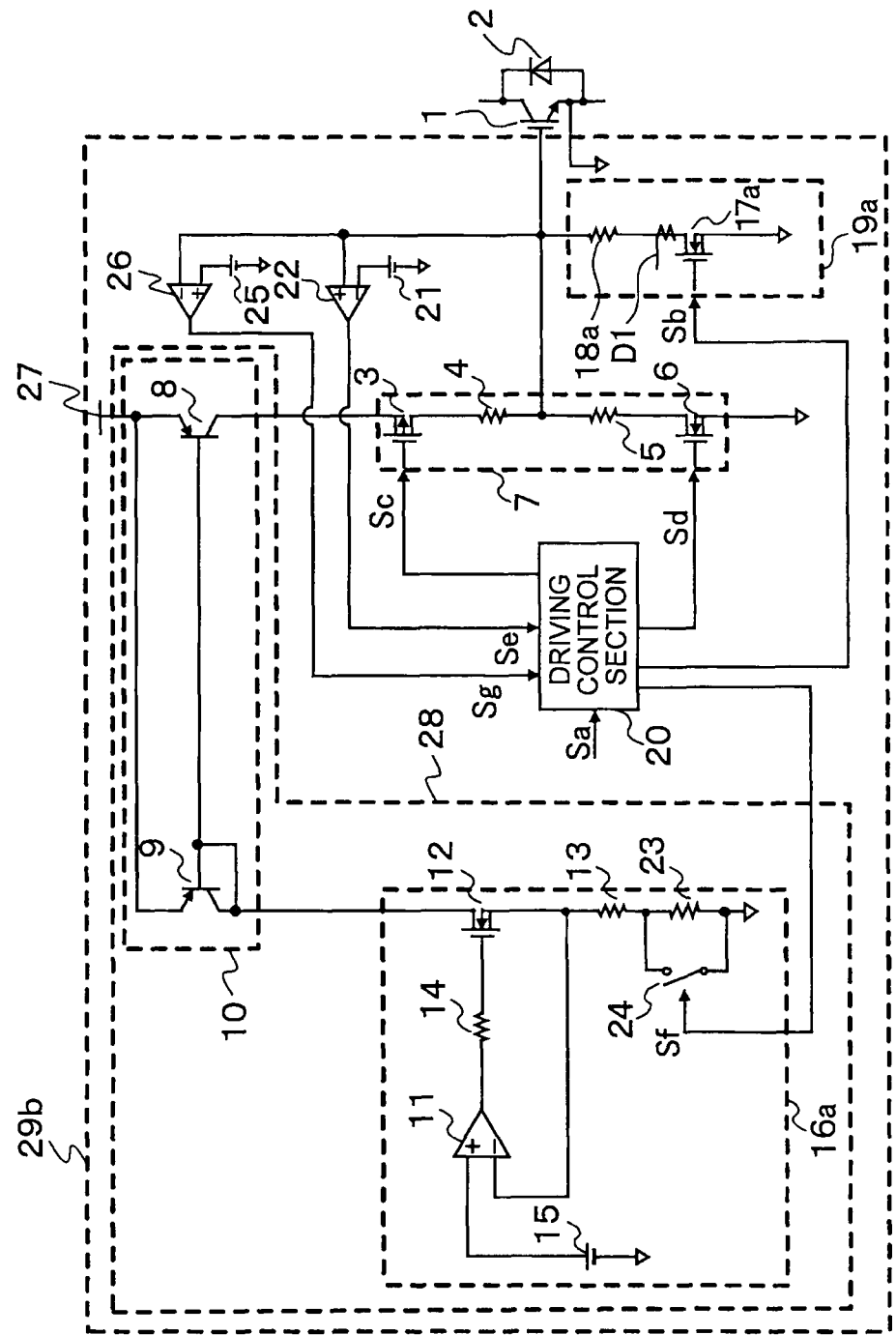
FIG. 8 is a circuit diagram illustrating a gate driving circuit according to Embodiment 3 of the present invention.

FIG. 8 is a circuit diagram illustrating a gate driving circuit according to Embodiment 3 of the present invention. In FIG. 8, the same or corresponding portions as in the embodiments described above are denoted by the same or related reference symbols and thus the description thereof is omitted. In a gate driving circuit 29b illustrated in FIG. 8, a current of a constant current circuit 16a is set to a small value in a normal state and set to a large value if necessary. Therefore, a resistor 23 is connected in series to the set resistor 13 for setting a constant current value of the constant current circuit 16a, and a switch 24 for short-circuiting both ends of the resistor 23 is connected in parallel to the resistor 23. Comparators 22 and 26 for comparing the gate voltage and a voltage which is set in advance are connected to the gate terminal of the IGBT 1.

The comparator 22 including input terminals connected to a first reference power source 21 for generating a first reference voltage and the gate terminal of the IGBT 1 compares the gate voltage with the first reference voltage 21, and outputs, to the driving control section 20, a signal Se which becomes "H" when the gate voltage is higher than the first reference voltage 21. The driving control section 20 outputs, based on the signal Se, a control command signal Sf for turning off the switch 24 with a predetermined delay. The comparator 26 including input terminals connected to a second reference power source 25 for generating a second reference voltage lower than the first reference voltage 21 and the gate terminal of the IGBT 1 compares the gate voltage with the second reference voltage 25, and outputs, to the driving control section 20, a signal Sg which becomes "H" when the gate voltage is lower than the second reference voltage 25. The driving control section 20 outputs, based on the signal Sg, the control command signal Sb for turning on the auxiliary current supply circuit 19a.

Up to Embodiment 2, the auxiliary current supply circuits 19 and 19a are turned on until the influence of the displacement current of the current mirror circuit 10 disappears to obtain the constant current. In Embodiment 3, a change in the current value of the constant current circuit 16a takes time, and hence it is also necessary to take a rising speed into account.

Figure 9:
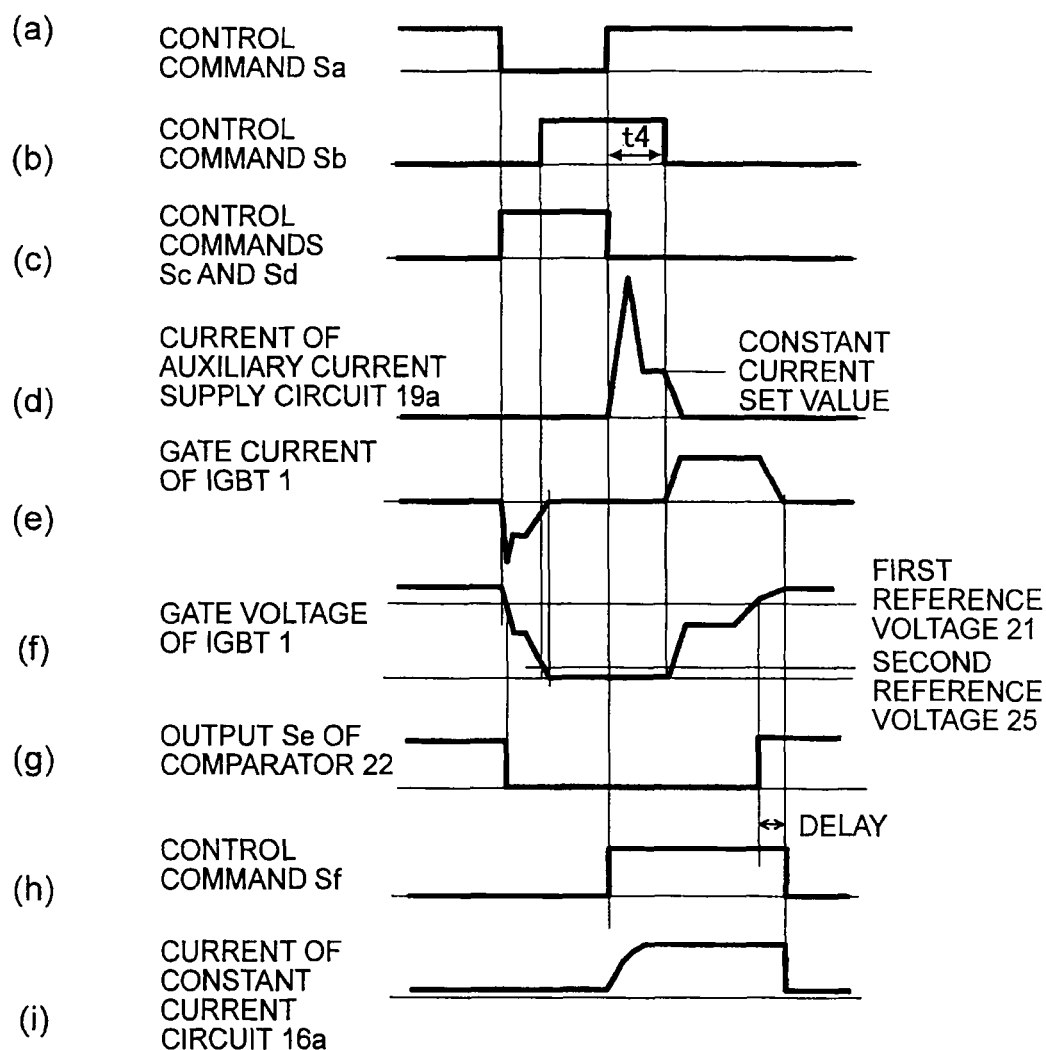
FIG. 9 is an explanatory timing chart illustrating an operation in Embodiment 3 of the present invention.
Figure 10:
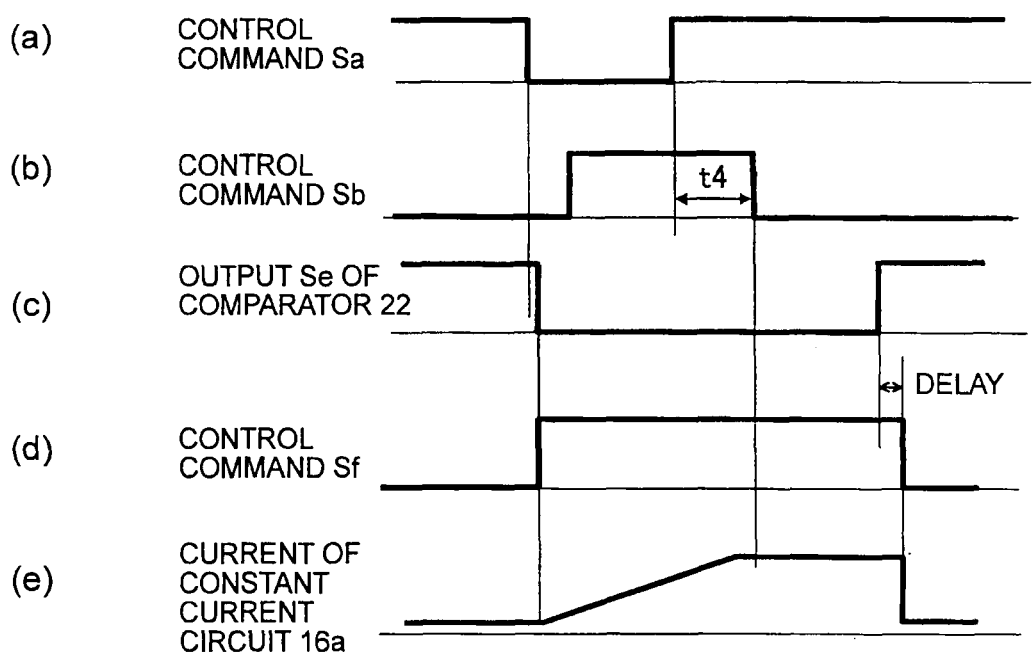
FIG. 10 is an explanatory timing chart illustrating the operation in Embodiment 3 of the present invention.

FIGS. 9 and 10 are explanatory timing charts illustrating operations of the circuit illustrated in FIG. 8 in cases where the start-up of the constant current circuit is fast and delayed. In FIG. 9 illustrating the case where the start-up of the constant current circuit is fast, (a) exhibits the control command signal Sa, (b) exhibits the control command signal Sb, (c) exhibits the control command signals Sc and Sd, (d) exhibits a current of the auxiliary current supply circuit 19a, (e) and (f) exhibits the gate current and gate voltage of the IGBT 1, respectively, (g) exhibits the output Se of the comparator 22, (h) exhibits the control command signal Sf, and (i) exhibits the current of the constant current circuit 16a. In FIG. 10 illustrating only feature parts in the case where the start-up of the constant current circuit is delayed, (a) exhibits the control command signal Sa, (b) exhibits the control command signal Sb, (c) exhibits the output Se of the comparator 22, (d) exhibits the control command signal Sf, and (e) exhibits the current of the constant current circuit 16a.

Hereinafter, the operations are described with reference to FIGS. 8 to 10. The case where the start-up of the constant current circuit 16a is fast is described.

When the IGBT 1 is turned off and the gate voltage of the IGBT 1 becomes lower than the second reference voltage 25 ((f) of FIG. 9), the driving control section 20 outputs the control command signal Sb of "H" based on the signal Sg of "H" indicating that the gate voltage of the IGBT 1 is lower than the second reference voltage 25 from the comparator 26 ((b) of FIG. 9). Then, the second switch 17*a* of the auxiliary current supply circuit 19*a* is turned on. The driving control section 20 sets the control command signal Sf ((h) of FIG. 9) for the switch 24 to "H" at the rising of the control command signal Sa ((a) of FIG. 9), to thereby turn on the switch 24. Then, the current of the constant current circuit 16*a* increases to a large value ((i) of FIG. 9).

At this time, the first switch 3 is also turned on in response to the control command signal Sc and the N-channel MOS-FET 6 is turned off ((c) of FIG. 9). A drain current of the turned-on first switch 3 (current flowing through auxiliary current supply circuit 19*a* in this case) is determined by superimposing together a displacement current component of the current mirror circuit 10 and a rising response delay component of the constant current circuit 16*a*, and thus has a waveform as exhibited by (d) illustrated in FIG. 9. The suitable time t4 is set in the same structure and method as in Embodiment 2 described above so that the control command signal Sb is "L" when the drain current of the first switch 3 becomes the constant current, to thereby turn off the second switch 17*a* ((b) of FIG. 9). When the auxiliary current supply circuit 19*a* is turned off, the constant current flows into the gate terminal of the IGBT 1 ((d) of FIG. 9). After that, when the gate voltage becomes higher than the first reference voltage 21 ((f) of FIG. 9), the signal Se from the comparator 22 becomes "H" ((g) of FIG. 9). Then, the driving control section 20 sets the control command signal Sf to "L" with a predetermined delay time from the signal Se of "H" ((h) of FIG. 9). Therefore, the switch 24 is turned off, and hence the current of the constant current circuit 16*a* reduces to a small value ((i) of FIG. 9).

In the case where the start-up of the constant current circuit 16*a* is delayed, when the control command signal Sf for the switch 24 is set to "H" at the rising of the control command signal Sa as described with reference to FIG. 9, there may be no time to start up the constant current circuit 16*a* and obtain the constant current before a timing of current turn from the auxiliary current supply circuit 19*a* to the gate (before control command signal Sb is in off state).

Therefore, as illustrated in the timing chart of FIG. 10, the signal of the output Se of the comparator 22 which becomes "H" when the gate voltage is lower than the first reference voltage 21 is used ((c) of FIG. 10), and the driving control section 20 sets the control command signal Sf to "H" at a time when the output Se of the comparator 22 becomes "L" ((d) of FIG. 10), to thereby turn on the switch 24. The second switch 24 is turned on before the rising of the control command signal Sa ((a) of FIG. 10). Thus, before the control command signal Sb becomes "L" ((b) of FIG. 10), the constant current circuit 16*a* may be started up and brought into a constant current state ((e) of FIG. 10), and hence the constant current may be turned to flow from the auxiliary current supply circuit 19*a* into the gate terminal of the IGBT 1.

Figure 11:
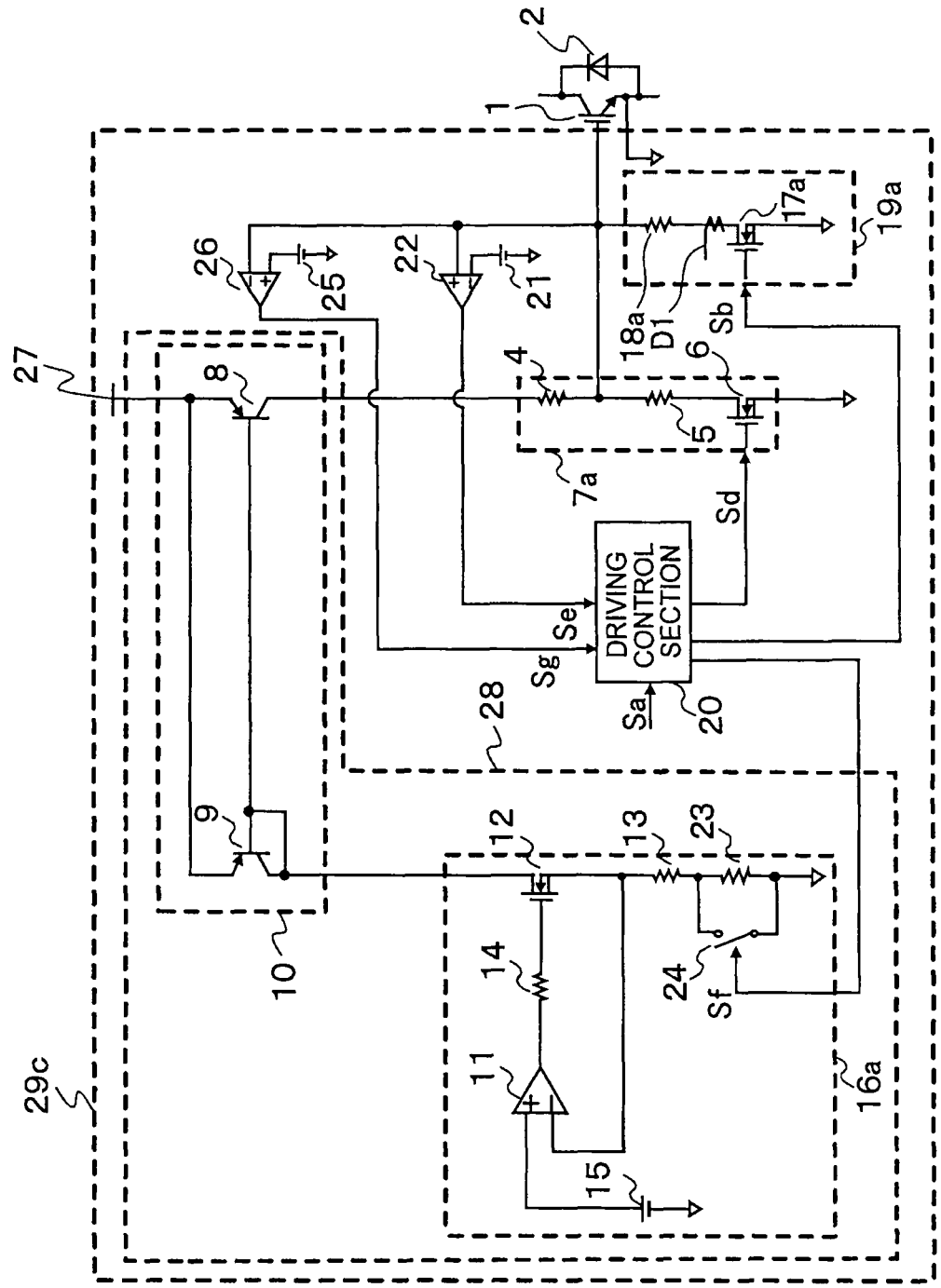
FIG. 11 is a circuit diagram illustrating a modified example of the gate driving circuit according to Embodiment 3 of the present invention.

In the case where the start-up of the constant current circuit 16*a* (current increases and current value becomes stable state) is fast, the P-channel MOSEFT 3 for turn-on control in the switching circuit 7 may be omitted to provide a gate driving circuit 29*c* illustrated in FIG. 11. In this case, the switch 24 for current control in the constant current circuit 16*a* of the constant current driving circuit 28 serves as the first switch, and the turning-on/off of the first switch is controlled based on the control command signal Sf. In the case where the start-up of the constant current circuit 16*a* is delayed, the P-channel MOSEFT 3 for turn-on control in the switching circuit 7 is desirable to be provided.

Figure 12:
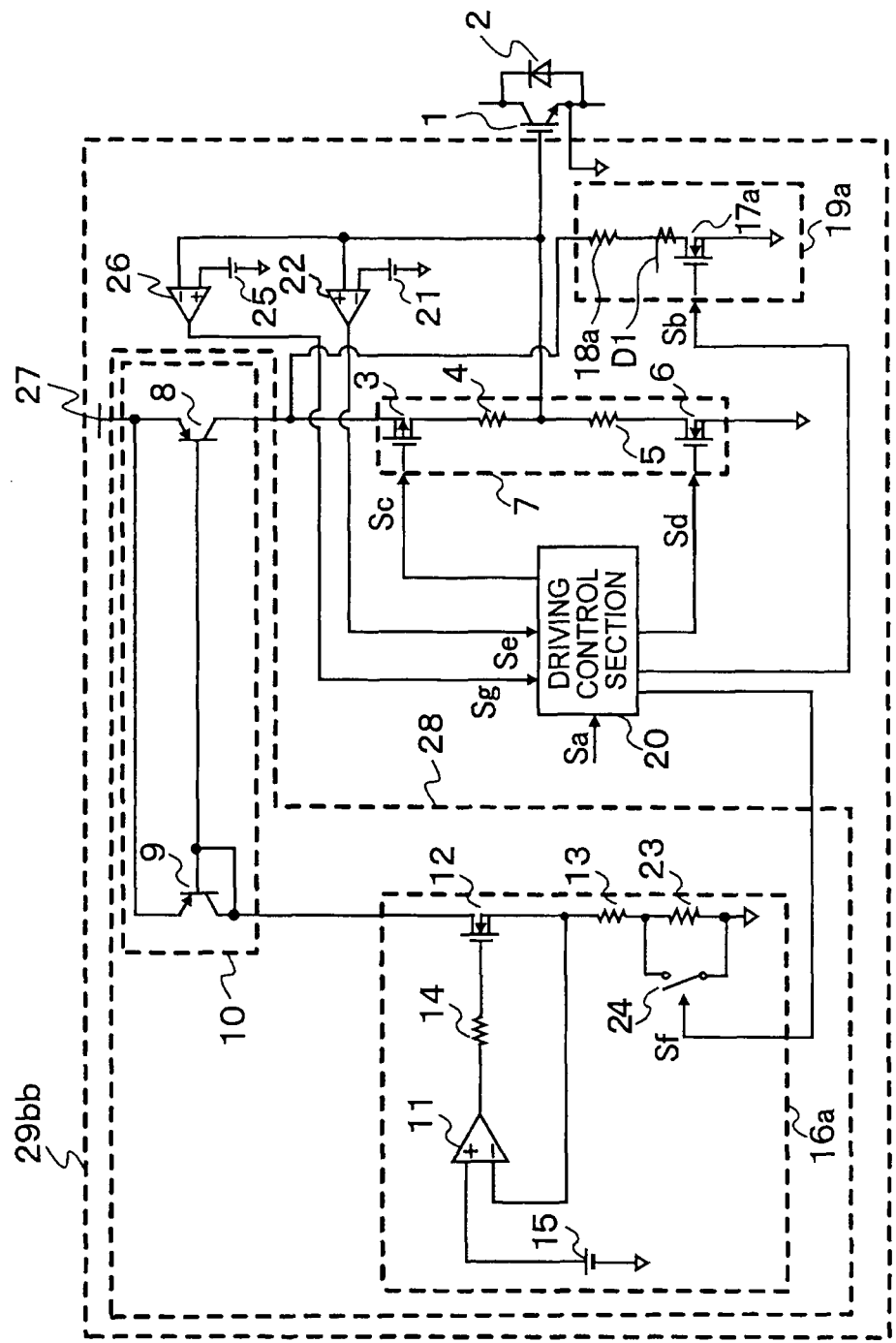
FIG. 12 is a circuit diagram illustrating another modified example of the gate driving circuit according to Embodiment 3 of the present invention.
Figure 13:
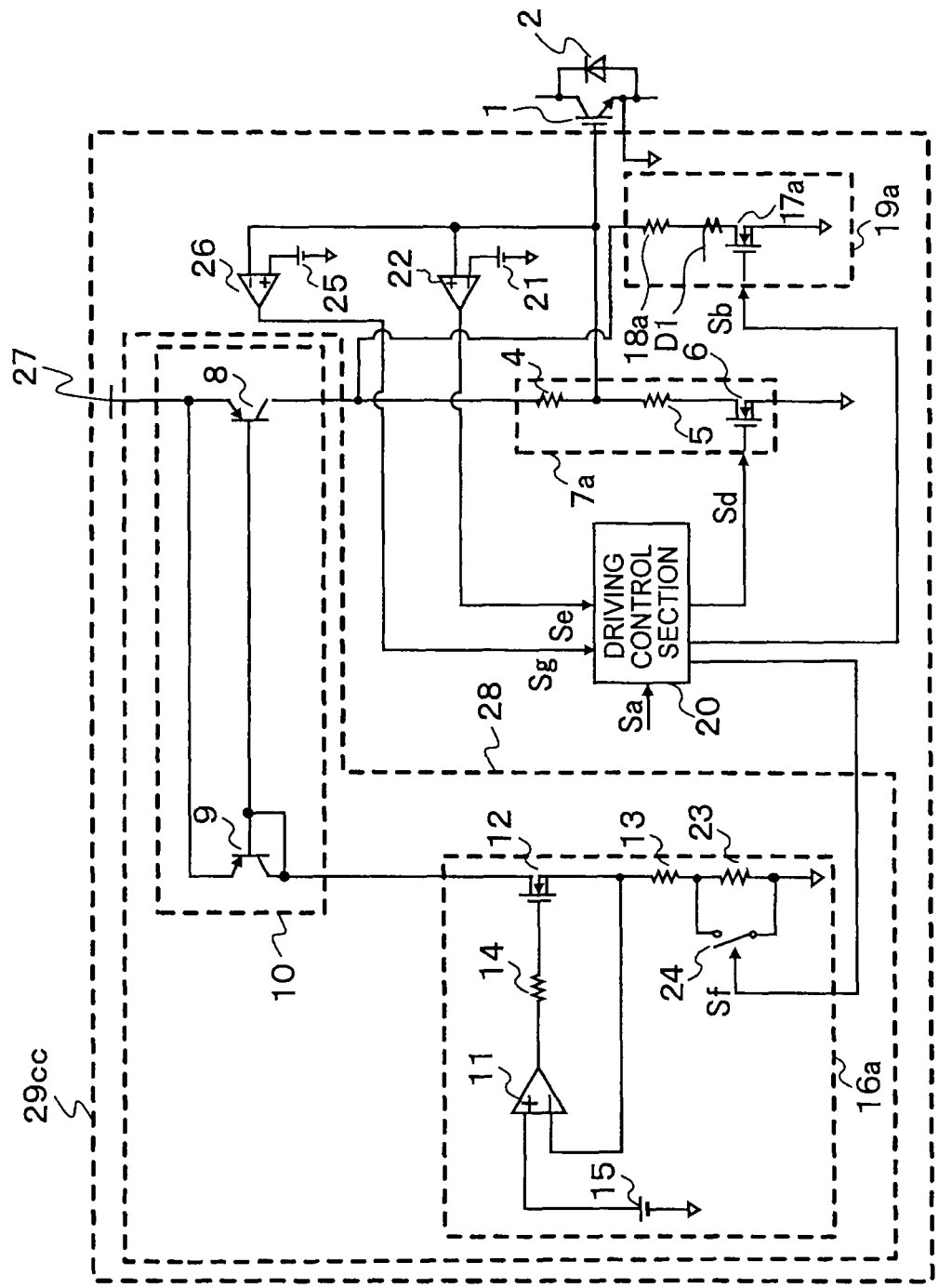
FIG. 13 is a circuit diagram illustrating another modified example of the gate driving circuit according to Embodiment 3 of the present invention.

In the gate driving circuits 29*b* and 29*c* illustrated in FIGS. 8 and 11, the auxiliary current supply circuit 19*a* is connected to the gate terminal of the IGBT 1, but may be connected between the current mirror circuit 10 of the constant current driving circuit 28 and the switching circuit 7 or 7*a*. FIG. 12 illustrates a gate driving circuit 29*bb* realized in the gate driving circuit 29*b* illustrated in FIG. 8. FIG. 13 illustrates a gate driving circuit 29*cc* realized in the gate driving circuit 29*c* illustrated in FIG. 11.

In each of the gate driving circuits 29*bb* and 29*cc* having the structures as described above, even when the threshold voltage varies, the variation in turn-on loss is suppressed, and hence an efficient thermal design may be performed. The current value of the constant current circuit is switched for driving only if necessary, and hence there is an effect that the loss of the gate driving circuit is suppressed.

Embodiment 4

Figure 14:
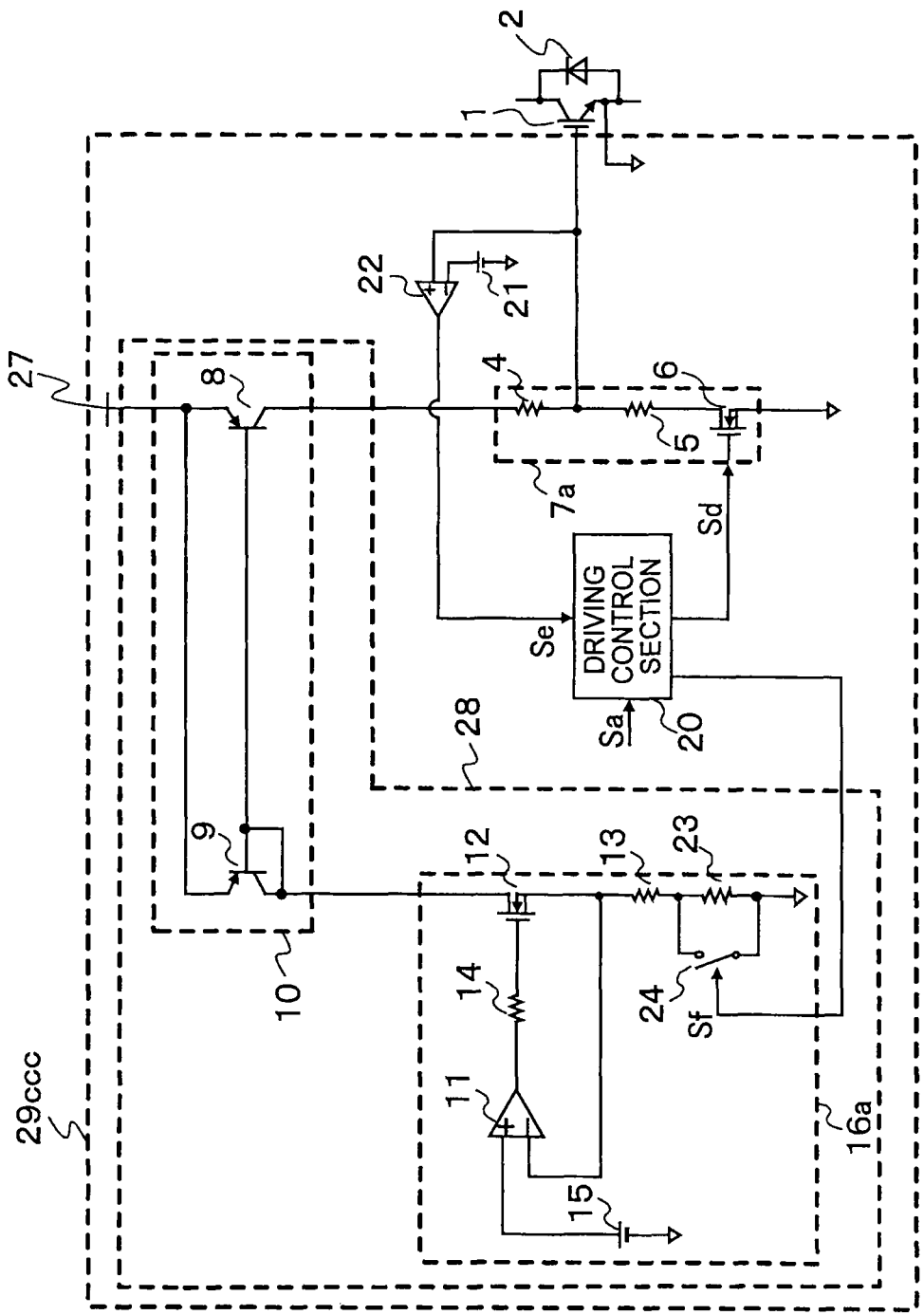
FIG. 14 is a circuit diagram illustrating a gate driving circuit according to Embodiment 4 of the present invention.

FIG. 14 is a circuit diagram illustrating a gate driving circuit according to Embodiment 4 of the present invention. In FIG. 14, the same or corresponding portions as in the embodiments described above are denoted by the same or related reference symbols and thus the description thereof is omitted. In a schematic structure of a gate driving circuit 29*ccc* illustrated in FIG. 14, the comparator 26 and the auxiliary current supply circuit 19*a* are removed from the gate driving circuit 29*c* illustrated in FIG. 11 and a resistor having a large resistance value is used as the resistor 23.

A current of the constant current circuit 16*a* is set to a small value in a normal state and set to a large value if necessary. Therefore, the resistor 23 is connected in series to the set resistor 13 for setting the constant current value of the constant current circuit 16*a*, and the switch 24 is connected in parallel to the resistor 23. The comparator 22 for comparing the gate voltage with the first reference voltage (may have different voltage value from embodiments described above) of the first reference power source 21 which is set in advance is connected to the gate terminal of the IGBT 1. The comparator 22 compares the first reference voltage 21 with the gate voltage. When the gate voltage is higher than the first reference voltage 21, the signal Se of "H" is output to the driving control section 20. Upon receiving the signal Se of "H", the driving control section 20 sets the control command signal Sf to "L" with a predetermined delay to turn off the switch 24.

Figure 15:
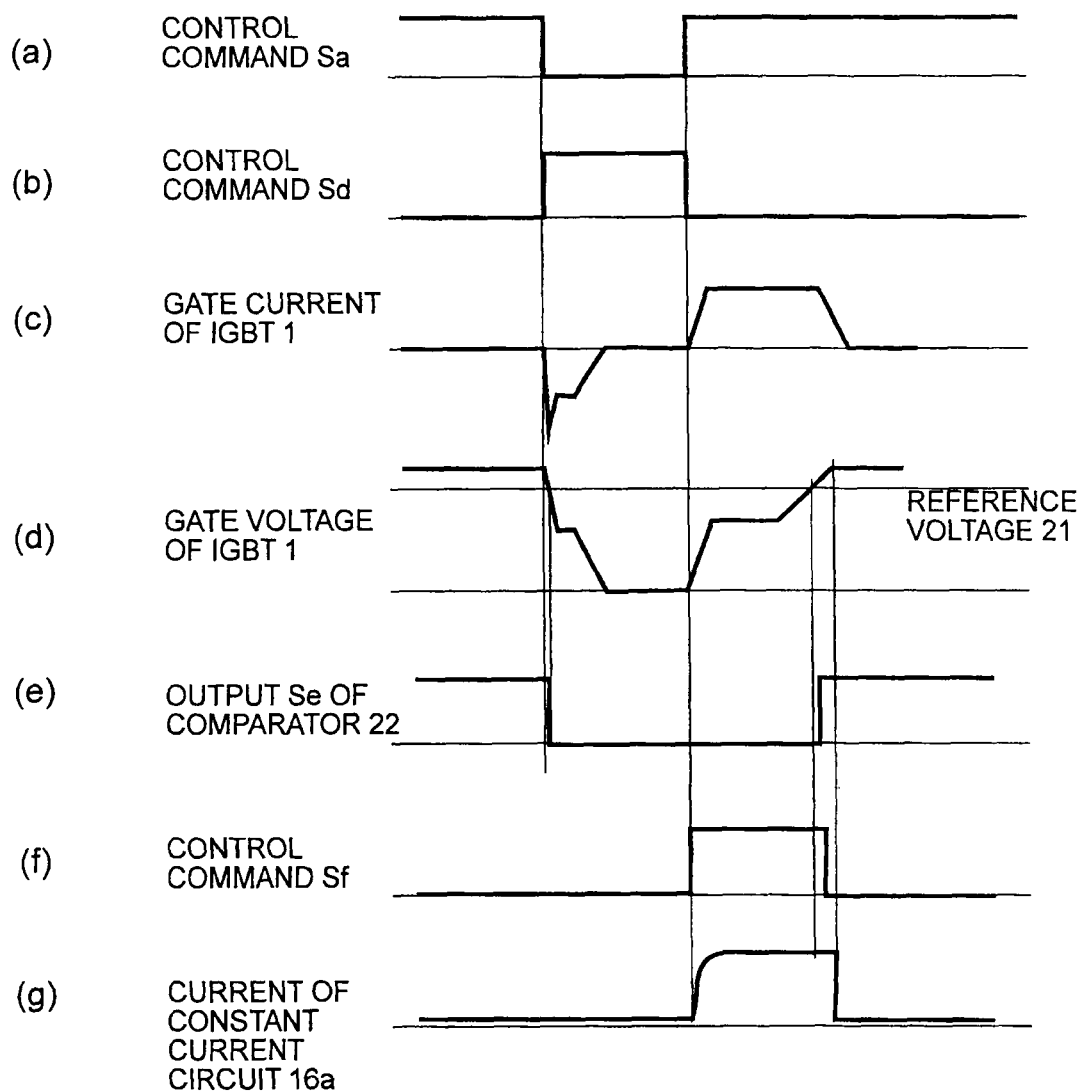
FIG. 15 is an explanatory timing chart illustrating an operation in Embodiment 4 of the present invention.

FIG. 15 is an explanatory timing chart illustrating an operation of the circuit illustrated in FIG. 14. In FIG. 15, (a) exhibits the control command signal Sa, (b) exhibits the control command signal Sd, (c) and (d) exhibit the gate current and gate voltage of the IGBT 1, respectively, (e) exhibits the output Se of the comparator 22, (f) exhibits the control command signal Sf, and (g) exhibits the current of the constant current circuit 16*a*.

Hereinafter, the operation is described with reference to FIGS. 14 and 15. The driving control section 20 sets the control command signal Sf ((f) of FIG. 15) for the switch 24 to "H" in synchronization with the rising of the control command signal Sa ((a) of FIG. 15). Then, a current flows through the constant current circuit 16*a* as illustrated in (g) of FIG. 15 and the gate voltage of the IGBT 1 is increased as illustrated in (d) of FIG. 15. As described above, the comparator 22 compares the first reference voltage 21 with the gate voltage. When the gate voltage is higher than the first reference voltage 21, the signal Se of "H" is output to the driving control section 20. Upon receiving the signal Se of "H", the driving control section 20 sets the control command signal Sf to "L"

with a predetermined delay time, to thereby turn off the switch 24. Then, the current of the constant current circuit 16*a* reduces ((g) of FIG. 15). In this case, the current value of the constant current circuit 16*a* reduces after the gate voltage becomes a predetermined voltage higher than the first reference voltage 21 because of the comparator 22, the control command signal Sf, and the operation delay of the constant current circuit 16*a*.

Therefore, in order to control the gate current flowing into the gate terminal of the IGBT 1, the current value of the constant current circuit 16*a* is adjusted. When the IGBT 1 is to be turned on, a large current is set. After it is determined by the comparator 22 that the charging of the gate terminal of the IGBT 1 is completed, a small current is set.

The resistor 23 is larger in value than the resistor 13 by, for example, three orders of magnitude. The output voltage of the operational amplifier 11 slightly varies before and after the turning-on of the switch 24, and hence a high-speed operation may be achieved. Note that it is not desirable to set a very large value (infinite value (corresponding to open value)) as the value of the resistor 23. When the resistor 23 is opened, a potential at one end of the operational amplifier 11 is indeterminable and thus not equal to the reference voltage of the reference power source 15. The potential at the one end cannot be controlled based on the output of the operational amplifier 11, and hence the output of the operational amplifier 11 takes any one of "H" and "L". When the switch 24 is to be turned on to obtain a predetermined constant current value after such a state, it takes a very long time because the operational amplifier 11 or the N-channel MOSFET 12 has a slow response speed. Note that the value of the resistor 23 may be set to a resistance value other than the value described above such that the gate is not charged and discharged when the switch 24 is turned off. A resistor having several tens kΩ is normally provided between the gate and the emitter and there is a discharging component because of the resistor, and hence the discharging component is compensated by the set resistance value.

Figure 16:
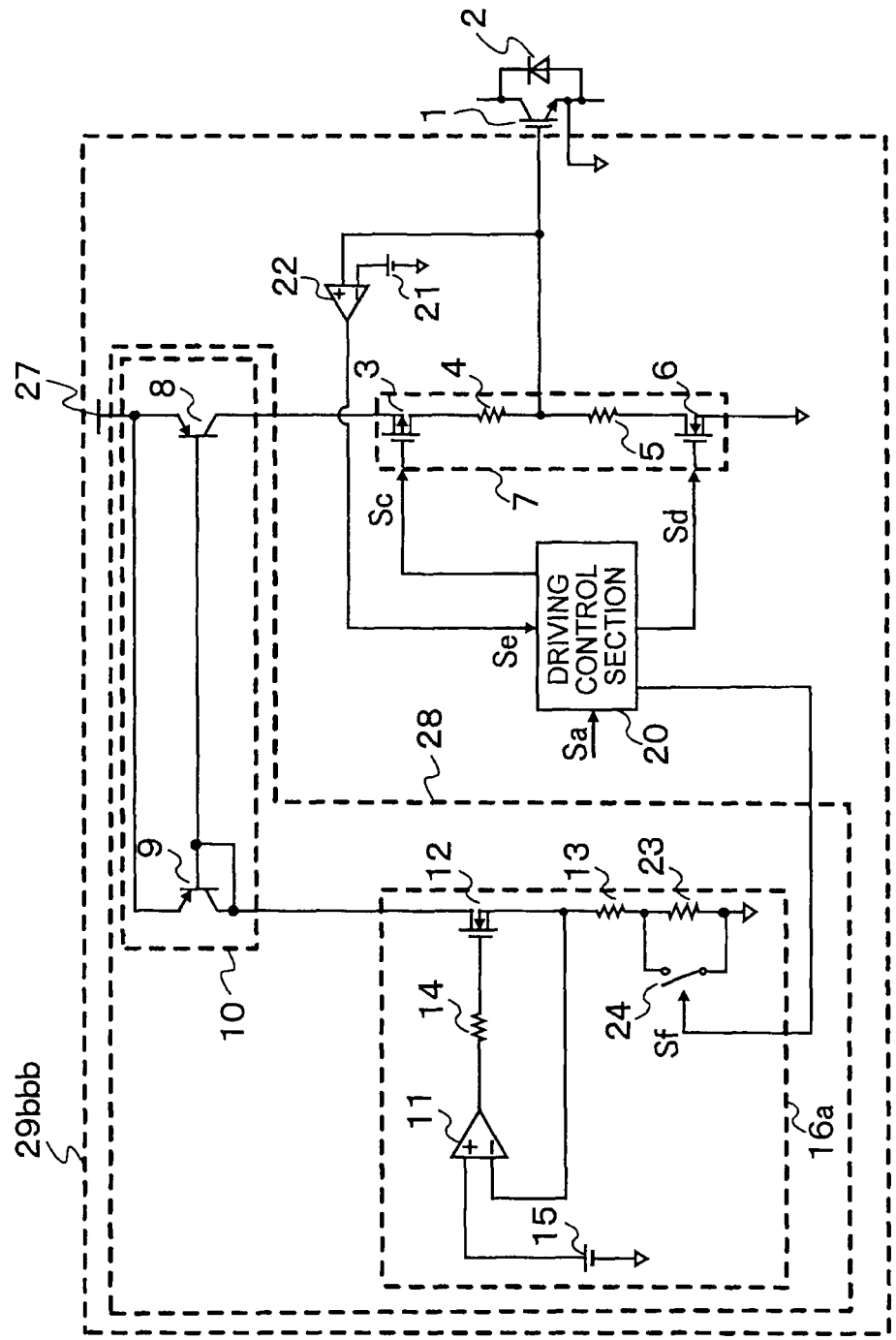
FIG. 16 is a circuit diagram illustrating a modified example of the gate driving circuit according to Embodiment 4 of the present invention.

Even in the case of the gate driving circuit 29*b* illustrated in FIG. 8 in which the switching circuit 7 includes the P-channel MOSFET 3, a gate driving circuit 29*bbb* illustrated in FIG. 16 may be embodied.

In each of the gate driving circuits 29*bbb* and 29*ccc* having the structures as described above, the constant current circuit operates at high speed, and hence the gate terminal is charged with the constant current value. Therefore, even when the threshold voltage varies, the variation in turn-on loss is suppressed, and hence an efficient thermal design may be performed. The current value of the constant current circuit is switched for driving only if necessary, and hence there is an effect that the loss of the gate driving circuit is suppressed.

The present invention is not limited to the respective embodiments described above and thus encompasses a structure with a circuit having the same function. The present invention encompasses an allowable combination of the respective embodiments described above.

INDUSTRIAL APPLICABILITY

The gate driving circuit according to the present invention is usable in many fields.

The invention claimed is:

1. A gate driving circuit for performing switching control on a power semiconductor element which has a gate, said gate driving circuit comprising:

a constant current driving circuit which is connected to a positive power source for charging said gate to let said power semiconductor element be turned on;

a gate terminal connected to said gate, which is connected to an output terminal of said constant current driving circuit;

an auxiliary current supply circuit which is connected to the output terminal of said constant current driving circuit or connected to said gate terminal;

a first switch which is provided in said constant current driving circuit, wherein said constant current driving circuit comprises a plurality of resistors connected in series and said first switch is connected in parallel to one of said plurality of resistors, or provided outside of said constant current driving circuit, wherein a first terminal of said first switch is connected to said positive power source and a second terminal of said first switch is connected to said gate terminal;

a second switch for turning on and off said auxiliary current supply circuit; and a driving control section that outputs signals for turning on and off said first switch and said second switch.

2. The gate driving circuit according to claim 1, wherein said driving control section turns on said second switch to supply a current output from said constant current driving circuit to said auxiliary current supply circuit, and turns on said first switch and turns off said second switch after the current supplied to said auxiliary current supply circuit is held to a predetermined current value, to thereby turn the current output from said constant current driving circuit to flow into said gate terminal.

3. The gate driving circuit according to claim 2, further comprising:

a comparator for comparing a voltage at said gate terminal with a first set voltage value and outputting a signal indicating that the voltage is higher than the first set voltage value, wherein said driving control section increases the current from said constant current driving circuit in response to a signal for turning on said power semiconductor element, and reduces the current from said constant current driving circuit in response to the signal from said comparator.

4. The gate driving circuit according to claim 3, wherein:

said constant current driving circuit further comprises a switch for adjusting a resistance value to vary the current from said constant current driving circuit; and said driving control section turns on and off said switch to vary the current from said constant current driving circuit.

5. The gate driving circuit according to claim 4, wherein said switch comprises an on-off switch connected in parallel to series resistors of said constant current driving circuit.

6. The gate driving circuit according to claim 2, further comprising:

a comparison section for comparing a voltage at said gate terminal with a first set voltage value, outputting a first signal when the voltage is higher than the first set voltage value, comparing the voltage at said gate terminal with a second set voltage value lower than the first set voltage value, and outputting a second signal when the voltage is lower than the second set voltage value, wherein said driving control section reduces the current from said constant current driving circuit in response to the first signal, and increases the current from said constant current driving circuit in response to the second signal.

7. The gate driving circuit according to claim 6, wherein:
said constant current driving circuit further comprises a switch for adjusting a resistance value to vary the current from said constant current driving circuit; and
said driving control section turns on and off said switch to vary the current from said constant current driving circuit.

8. The gate driving circuit according to claim 7, wherein said switch comprises an on-off switch connected in parallel to series resistors of said constant current driving circuit.

9. The gate driving circuit according to claim 2, wherein said constant current driving circuit comprises a current mirror circuit and a constant current circuit for driving said current mirror circuit.

10. The gate driving circuit according to claim 1, wherein said constant current driving circuit comprises a current mirror circuit and a constant current circuit for driving said current mirror circuit.

11. The gate driving circuit according to claim 1, wherein said auxiliary current supply circuit includes at least one resistor.

12. The gate driving circuit according to claim 1, wherein said second switch is located between said gate terminal and ground.

13. The gate driving circuit according to claim 1, wherein said first switch is provided between said output terminal and said gate terminal.

* * * * *